United States Patent [19]

Jeenicke et al.

[11] Patent Number: 4,651,292

[45] Date of Patent: Mar. 17, 1987

[54] TEMPERATURE COMPENSATION OF A LINEAR SENSOR

[75] Inventors: Edmund Jeenicke, Schwieberdingen; Manfred Schenk, Fellbach; Hans-Jörg Schmid, Langenau, all of Fed. Rep. of Germany

[73] Assignee: Robert Bosch GmbH, Stuttgart, Fed. Rep. of Germany

[21] Appl. No.: 817,154

[22] Filed: Jan. 7, 1986

Related U.S. Application Data

[63] Continuation of Ser. No. 478,688, Mar. 25, 1983, abandoned.

[30] Foreign Application Priority Data

Apr. 5, 1982 [DE] Fed. Rep. of Germany ....... 3212611

[51] Int. Cl.$^4$ .............................................. G08C 21/00
[52] U.S. Cl. .................................... 364/571; 364/557; 73/861.03; 73/765
[58] Field of Search ............... 364/556, 557, 558, 571; 73/708, 765, 766, 861.02, 861.03

[56] References Cited

U.S. PATENT DOCUMENTS

| | | | |
|---|---|---|---|
| 3,978,727 | 9/1976 | Griveras | 783/861.03 |
| 4,198,676 | 5/1980 | Varnum et al. | 364/557 |
| 4,234,927 | 11/1980 | First | 364/557 |
| 4,281,382 | 7/1981 | Knoll et al. | 364/571 |
| 4,298,947 | 11/1981 | Tamura et al. | 364/557 |
| 4,381,608 | 5/1983 | Thorman | 364/557 |
| 4,392,382 | 7/1983 | Myers | 73/766 |
| 4,437,164 | 3/1984 | Branch, III | 364/557 |
| 4,455,095 | 6/1984 | Bleiker | 364/557 |
| 4,477,877 | 10/1984 | Nakamura et al. | 364/551 |

FOREIGN PATENT DOCUMENTS 0140055 12/1978 Japan ...................................... 73/765

*Primary Examiner*—Parshotam S. Lall
*Attorney, Agent, or Firm*—Frishauf, Holtz, Goodman & Woodward

[57] ABSTRACT

In the case of sensors having a characteristic for which the offset in the quiescent condition has a first temperature coefficient and the slope of the characteristic has a second temperature coefficient, while the quotient of the offset and slope coefficients is approximately constant, a point can be determined in which the characteristics for different temperatures (T) intercept. A temperature corrected measurement value can be determined, preferably with a microcomputer, from the sensor signal, the coordinates of the above-described intersection point, the sensor temperature and the temperature coefficient either of the offset or of the slope.

5 Claims, 3 Drawing Figures

TEMPERATURE COMPENSATION OF A LINEAR SENSOR

This application is a continuation of application Ser. No. 478,688, filed Mar. 25, 1983, now abandoned.

This invention concerns a method of temperature compensation of an electrical signal of a linear sensor, in particular a sensor of the kind that has a first temperature coefficient, in the inactive condition, for the signal value (known as offset) and a second temperature coefficient for the slope of the sensor characteristic.

Various kinds of sensors are known in which the sensor signal, typically an electrical signal, depends linearly on the physical value to be measured, at least to a close approximation. The sensor signal for a quiescent or inactive sensor (physical value measured equal to zero) is usually called the "offset". It is known that such sensors have a temperature coefficient and in fact a distinction is made between the temperature coefficient of the offset and the temperature coefficient of the slope of the approximately linear sensor characteristic.

It is known to compensate the temperature dependence of the signal of such a sensor by providing a multiplicity of potentiometers in the measuring circuit for respectively producing characteristics (i.e., of different slopes) in the measuring circuit which compensate the aforesaid temperature coefficients. Such measuring circuits are extremely complex, because in the case of a multiplicity of balancing or compensating means, the shift of one balancing element also requires the shift of other balancing elements, so that a correct compensation is possible only according to a regulation-technique "strategy". The complexity of such arrangements, furthermore, inherently brings in the risk of effects from further temperature dependencies of the various components.

THE INVENTION

It is an object of the present invention to provide simple and effective temperature compensation of a sensor of the kind described above without the complication of multiple compensating or balancing circuits.

Briefly, in a sensor of the kind described, it is found that, quite generally, the quotient obtained by dividing the temperature coefficient of the offset by the temperature coefficient of the slope is approximately constant, and the respective characteristics of the sensor for various temperatures cross each other approximately in a single point. For the measurement method of the invention, therefore, the coordinates of that point, in terms of the sensor signal and the physical value measured by the sensor, are determined by calculation either directly from observed data or from data derived from observed data and furnished with the sensor. The slope of the sensor characteristic at a reference temperature is determined. The sensor temperature is measured. Then for measurements at that sensor temperature, the physical value to be measured is obtained as a function of (a) the sensor signal, (b) the coordinates of the aforesaid point, (e) the aforesaid reference temperature slope, (d) the actual sensor temperature and (e) the temperature coefficient of the slope of the sensor characteristic for the particular sensor temperature.

More particularly, the measured value is obtained by means of the relation:

$$P_{(T)} = P_0 + \frac{U_{(P,T)} - U_0}{k_0(1 + TK_k \Delta T)}$$

in which
- $P_0$ and $U_0$ are said coordinates of said point,
- $U_{(P,T)}$ is the sensor signal,
- $k_0$ is said slope of the sensor characteristic at said reference temperature,
- T is the determined sensor temperature,
- $TK_k$ is the temperature coefficient of the characteristic slope at said sensor temperature, and
- $\Delta T$ is the temperature of difference $(T - T_0)$ between the measured temperature T and the reference temperature $T_0$.

The method of the invention has the advantage that an exact calculation of the temperature corrected measurement value is made possible with the knowledge of only a few basic magnitudes which have long-term stability. With the use of the evaluation relation above set forth, the temperature compensated signal values are readily obtainable through an evaluation circuit containing a microcomputer.

THE DRAWING

The invention is further described by way of illustrative example with reference to the annexed drawing, in which:

FIGS. 1 and 2 are graphs for illustrating the explanation of the method of the invention, and FIG. 3 is a circuit block diagram of an evaluation circuit for practicing the method of the invention with the help of a microcomputer.

DESCRIPTION OF THE ILLUSTRATED EMBODIMENT

Figure 1:
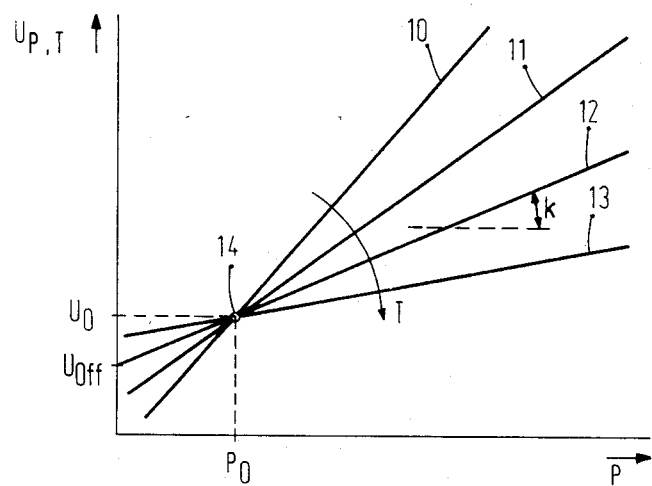

FIG. 1 is a graph showing several approximately linear characteristic lines 10, 11, 12 and 13 of a sensor, where the electrical signal U, which is a function of a physical magnitude P and of temperature T, is plotted against the physical value P to be measured, for example, a pressure, a force, an acceleration, a mass or the like. As already mentioned, the output signal U, which is usually an electric potential, varies in a manner dependent on the measured magnitude P and the ambient temperature T.

The linear characteristics 10, 11, 12 and 13 can be defined by the so-called offset $U_{off}$ and the slope k, which are shown for example for the linear characteristic 12 in FIG. 1. $U_{off}$ has a temperature coefficient $TK_{off}$ and k has a temperature coefficient $TK_k$. By treating the temperature T as a parameter subject to variation, a family of characteristic lines for a set of different temperatures is produced.

For any particular characteristic line, the following holds: $U_{(P,T)} = U_{off} + kP$. For the line 12, of which the slope is $k_0$ and the offset is $U_{off0}$ we have $U = U_{off0} + k_0 P$. If now the temperature changes by the amount $\Delta T$, so that the new temperature $T' = T_0 + \Delta T$, the following relation holds and defines other characteristic lines:

$$P_{(T)} = P_0 + \frac{U_{(P,T)} - U_0}{k_o(1 + TK_k \Delta T)}$$

The intersection of the two characteristic lines (corresponding to the characteristics before and after the temperature change) is determined by:

$$U_{(P,T)} = U_{(P,T0)}$$

from which we get:

$$U_{off} + TK_{off}\Delta T + (k_0 + k_0 \cdot TK_k \Delta T)P = U_{off} + k_0 P$$

and from that, the following holds for the abscissa value:

$$P = -(U_{off} TK_{off})/(k_0 TK_k)$$

This means that all such characteristic lines intersect each other in one point, provided that the quotient of the temperature coefficients of offset and slope remains constant. For such a case, the family of lines 10, 11, 12 and 13 shown in FIG. 1 results, the common point 14 of mutual intersection having the coordinates $U_0$, and P marked in FIG. 1. In what follows $U_0$ and $P_0$ signify the coordinates of that point.

These properties are utilized in the method of the invention in order to obtain the corresponding measured value $P_{(T)}$ from any desired sensor signal $U_{(P,T)}$. This will now be explained with reference to FIG. 2.

Figure 2:
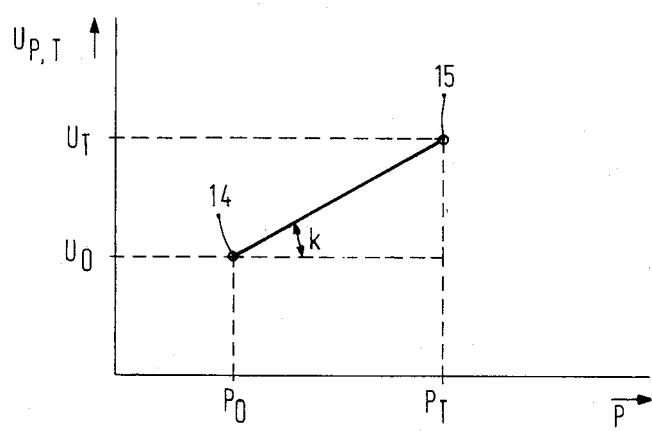

FIG. 2 relates to the case of a pressure sensor in which the sensor voltage $U_{(P,T)}$ is determined in a manner dependent upon the pressure P that reigns in the environment of the sensor and the ambient temperature T. The intersection 14 of the line family has the coordinates $U_0$, $P_0$ which are readily obtainable and substantially constant for a particular sensor. At a certain temperature the sensor produces the output voltage $U_1$. In order now to determine the corresponding measurement point 15 and thereby provide the measurement value $P_1$, it is first assumed that the abscissa value of the point 15, corresponding to $P_1$ can be obtained from the known temperature dependent slope k, the coordinates of the point 14 and the sensor signal $U_1$. The following holds for the slope k:

$$k = k_0[1 + (TK_k)(\Delta T)]$$

In the above $k_0$ signifies the slope of the characteristic line at the reference temperature $T_0$ with reference to which the temperature change $\Delta T$ is figured. Then for the abscissa value of the point 15, we have:

$$P_1 = P_0 + (U_1 - U_0)/k \text{ and hence}$$

$$P_1 = P_0 + (U_1 - U_0)/k_0(1 + TK_k \Delta T)$$

Figure 3:
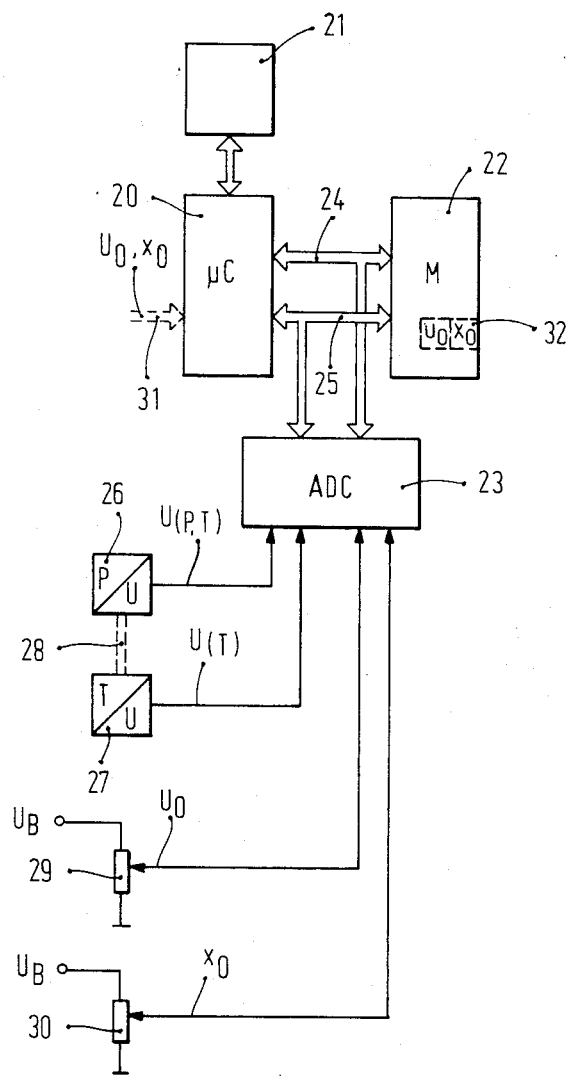

FIG. 3 shows an evaluation circuit by which temperature compensation can be carried out by the method above described. The evaluation circuit contains a microcomputer 20 which is operatively connected to an input/output circuit 21 not further described here, since input/output circuits, like microcomputers, are very well known in the measurement art. In addition there are provided a memory or storage unit 22 and an analog-to-digital converter 23. The units 20, 22 and 23 are connected together in a known way by a data bus 24 and an address bus 25. The input magnitudes are supplied by sensors 26 and 27 to the analog-to-digital converter 23, the sensor 26 being the actual measurement sensor, for example a pressure sensor which delivers the sensor signal $U_{(P,T)}$. The sensor 27 is a temperature sensor provided in the immediate neighborhood of the actual measurement sensor 26 as indicated at 28. The temperature 27 provides a signal $U_{(T)}$ which corresponds to the temperature of the sensor 26. In a first embodiment of the invention, the coordinates $U_0$, $P_0$ of the point 14 are supplied to the analog-to-digital converter 23 over potentiometers 29 and 30 respectively. In the case of every compensation calculation, the analog-to-digital converter 23 is then interrogated in order to obtain in digital form the values $U_0$ and $x_0$ which must be taken account of in the temperature compensation. This manner of proceeding has the advantage that the values $U_0$, $P_0$ can also be corrected later, for example when the sensor 26 is replaced.

The same applies also for another embodiment of the invention in which the values $U_0$, $P_0$ are supplied directly as digital signals at circuit inputs of the microcomputer 20, as indicated at 31, because here again, when the sensor 26 is replaced, the signals supplied to the microcomputer inputs can be changed if needed.

Finally, in a third embodiment of an evaluation circuit for use in the process of the invention, the values $U_0, P_0$ are deposited in a store 22, for example a ROM, as indicated at 32. In this manner, a particularly quick pick-up of this information with minimum vulnerability to disturbance is provided, as can advantageously be utilized if the values $U_0, P_0$ do not change.

It will be understood that the method above described and the evaluation circuit utilized is not limited to pressure sensors, but can be applied with advantage to the signals of all temperature-dependent sensors. Thus, although the invention has been described with reference to a particular illustrative example, variations and modifications are possible within the inventive concept.

Thus, for example, instead of using the temperature coefficient of the slope in the calculation of the temperature corrected measurement value, the temperature coefficient of the offset can be used.

We claim:

1. Method of temperature-compensating a sensor having, at any given temperature within a range of temperature suitable for use of the sensor, a straight characteristic line giving the relation between sensor output (7) and a physical property variable (P) measured by said sensor, said characteristic line having a slope (k) which has a first temperature coefficient ($TK_k$) and defining, for a predetermined value of said physical variable, a reference value ($U_{off}$) of sensor output which reference value has a second temperature coefficient ($TK_{off}$), said method depending upon the discovery that the respective characteristic lines of said sensor for various temperatures commonly cross in a point (14), said method comprising the steps of:

determining, from preliminary measurements of known magnitudes at not less than two different sensor temperatures the coordinates ($U_0$, $P_0$) of said point (14) representing a value of said physical variable for which the sensor output does not vary with temperature, and providing said coordinates and also said first and second temperature coefficients ($TK_k, TK_{off}$) as sensor constants to a microcomputer (20);

calculating the slope ($k_0$) of the sensor characteristic at a reference temperature ($T_0$) from said preliminary measurements and providing its value as a sensor constant to said microcomputer;

continually measuring the sensor temperature (T) and furnishing its value as an operating variable to said microcomputer;

continually furnishing said sensor signal ($U_{(P,T)}$) to said microcomputer for derivation of said physical variable ($P_{(T)}$);

deriving a value of said physical variable ($P_{(T)}$) from said sensor signal ($U_{(P,T)}$) and from the determined sensor temperature (T) by computation in said microprocessor in accordance with the relation:

$$P_{(T)} = P_0 + (U_{(P,T)} - U_0)/k_0(1 + TK_k\Delta T)$$

in which $P_0$ and $U_0$ are said coordinates of said point, $U_{(P,T)}$ is the sensor signal, $k_0$ is said slope for the sensor characteristic at said reference temperature, $\Delta T$ is the difference ($T - T_0$) between the determined sensor temperature (T) and the said reference temperature $T_0$ and $TK_k$ is the temperature coefficient of the sensor characteristic slope at said sensor temperature.

2. Method according to claim 1, in which the step of calculating the slope ($k_0$) of the sensor characteristic at said reference temperature ($T_0$) is performed by supplying data of said preliminary measurements to said computer for calculation in said computer.

3. Method according to claim 1, in which the step of providing said coordinates ($U_0$, $P_0$) of said point (14) to said microcomputer also includes the storing, in signal storage means (22) available to said microcomputer (20), digital signals (32) corresponding to said coordinates.

4. Method according to claim 1, in which the provision of said coordinates ($U_0, P_0$) of said point (14) is performed by setting first and second potentiometers (29, 30) to provide electrical outputs respectively representative of said coordinates and utilizing analog-to-digital converter means (23) for converting said potentiometer outputs into digital signals for use by said microcomputer (20).

5. Method according to claim 1, in which the provision of said coordinates ($U_0, P_0$) of said point (14) to said microcomputer (20) is performed by setting digital signal sources to produce digital signals corresponding to said coordinates and to supply them directly to said microcomputer.

* * * * *